United States Patent
Fujita (10) Patent No.: US 9,802,264 B2
(45) Date of Patent: Oct. 31, 2017

(54) SOLDER SUPPLY DEVICE INCLUDING A SENSOR TO DETECT MOVEMENT OF A SOLDER CONTAINER

(71) Applicant: FUJI MACHINE MFG. CO., LTD., Chiryu (JP)

(72) Inventor: Yoji Fujita, Okazaki (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 15/100,908

(22) PCT Filed: Dec. 18, 2013

(86) PCT No.: PCT/JP2013/083853
§ 371 (c)(1),
(2) Date: Jun. 1, 2016

(87) PCT Pub. No.: WO2015/092877
PCT Pub. Date: Jun. 25, 2015

(65) Prior Publication Data
US 2016/0303675 A1    Oct. 20, 2016

(51) Int. Cl.
*B05C 11/10* (2006.01)
*B23K 3/06* (2006.01)
(Continued)

(52) U.S. Cl.
CPC ........ *B23K 3/0638* (2013.01); *B05C 11/1002* (2013.01); *B41F 15/40* (2013.01);
(Continued)

(58) Field of Classification Search
CPC .............. B05C 11/101; B05C 11/1002; H05K 2203/0126; H05K 13/0469;
(Continued)

(56) References Cited

U.S. PATENT DOCUMENTS 4,047,645 A * 9/1977 Caliendo ............... B05B 9/0838
                                                222/386.5
4,268,953 A * 5/1981 Tetro ....................... G01F 23/70
                                                29/602.1
(Continued)

FOREIGN PATENT DOCUMENTS

JP          6-106111 A       4/1994
JP       2004-306102 A      11/2004
JP       2012-106416 A       6/2012

OTHER PUBLICATIONS

International Search Report dated Apr. 1, 2014, in PCT/JP2013/083853 filed Dec. 18, 2013.

*Primary Examiner* — Karl Kurple
(74) *Attorney, Agent, or Firm* — Oblon, McClelland, Maier & Neustadt, L.L.P.

(57) ABSTRACT

A solder supply device is provided with a solder cup housing liquid solder that is cylindrical and open at one end; a nozzle section, for ejecting solder from the solder container, that is inserted into the solder container; a flange section that is provided on an outer circumferential section of the nozzle section and that is engaged inside of the solder cup; solder supplied from the tip of the nozzle section by the solder cup being moved; a magnet provided in the outer circumferential surface of the solder cup; and magnetic sensors able to detect the approaching of the magnet are provided at a position facing the outer circumferential surface of the solder container. Based on the positions of the magnet and the sensor, the post-movement position of the solder container is detected. Thus, it can be detected that solder has run out from inside the solder cup.

7 Claims, 6 Drawing Sheets

US 9,802,264 B2
Page 2

(51) Int. Cl.
  *G01F 23/00* (2006.01)
  *B41F 15/40* (2006.01)
  *H05K 3/34* (2006.01)
  *B05B 9/08* (2006.01)
  *B05B 12/12* (2006.01)

(52) U.S. Cl.
  CPC .......... *G01F 23/00* (2013.01); *H05K 3/3484* (2013.01); *B05B 9/0838* (2013.01); *B05B 12/124* (2013.01); *H05K 2203/0126* (2013.01)

(58) Field of Classification Search
  CPC ....... H05K 2201/10151; H05K 3/3457; B23K 3/06; B23K 3/0607; B23K 3/0623; B23K 3/082; B05B 9/047; B05B 9/0838; B05B 12/081; B05B 12/124
  USPC ........ 222/325, 420, 51; 116/10, 204; 73/307
  See application file for complete search history.

(56) References Cited

U.S. PATENT DOCUMENTS

| | | | | |
|---|---|---|---|---|
| 4,527,717 A * | 7/1985 | Emoto | ................... | B22D 37/00 222/146.5 |
| 4,622,239 A * | 11/1986 | Schoenthaler | ........... | B23K 3/06 118/406 |
| 4,635,827 A * | 1/1987 | Roedig | .................... | B05C 7/00 118/410 |
| 4,720,402 A * | 1/1988 | Wojcik | ................. | B23K 3/0638 228/179.1 |
| 4,808,435 A * | 2/1989 | Cropp | ..................... | B41M 1/12 427/272 |
| 5,080,864 A * | 1/1992 | Shaw | .................. | B01L 3/50825 340/568.1 |
| 5,361,963 A * | 11/1994 | Ozawa | ................. | B23K 3/0607 118/256 |
| 5,376,414 A * | 12/1994 | Breeden | ........... | B05C 17/00579 118/410 |
| 5,647,510 A * | 7/1997 | Keller | ............... | B05C 17/00513 222/105 |
| 6,338,441 B1 * | 1/2002 | Umezawa | ............. | B05B 3/1064 239/104 |
| 6,736,291 B1 * | 5/2004 | Mimura | ................... | B05C 11/00 222/129 |
| 9,278,401 B2 * | 3/2016 | Biggs | ................... | B23K 3/0607 |
| 2001/0010324 A1 * | 8/2001 | Maeda | ................. | B23K 3/0623 228/256 |
| 2002/0038814 A1 * | 4/2002 | Mimura | ............... | B23K 3/0607 228/256 |
| 2006/0260541 A1 * | 11/2006 | Lee | ........................... | B05C 7/06 118/302 |
| 2009/0266295 A1 * | 10/2009 | Saunders | ................. | B05B 1/20 118/300 |
| 2010/0080912 A1 * | 4/2010 | Koyama | ............. | B05C 5/0225 427/256 |
| 2011/0315718 A1 * | 12/2011 | Levenstein | ........... | G01F 11/021 222/389 |
| 2013/0087057 A1 * | 4/2013 | Kondo | ................. | H05K 3/1233 101/123 |
| 2016/0158792 A1 * | 6/2016 | Frenkel | ............. | B05C 17/00569 118/50 |
| 2016/0158793 A1 * | 6/2016 | Frenkel | ............... | B05C 17/0341 15/104.94 |
| 2016/0297021 A1 * | 10/2016 | Senga | ...................... | B23K 3/06 |
| 2016/0338209 A1 * | 11/2016 | Senga | ...................... | B23K 3/06 |

* cited by examiner

SOLDER SUPPLY DEVICE INCLUDING A SENSOR TO DETECT MOVEMENT OF A SOLDER CONTAINER

The present disclosure relates to a solder supply device for supplying solder from a solder container housing liquid solder. The solder container is tubular and open at one end.

BACKGROUND ART

Among solder supply devices, there is a solder supply device that has a solder container housing liquid solder inside thereof, and a piston engaged inside the solder container, and that supplies solder in the solder container by raising the pressure inside the solder container by moving the solder container. With this type of device, when a solder container becomes empty, the empty solder container is exchanged with a new solder container. This means it is necessary to detect that a solder cup is empty. The patent literature below disclosed a solder supply device that supplies solder in which a solder container is moved by the driving of an electromagnetic motor; in the device, the drive amount of the electromagnetic motor is detected from the encoder, and the movement amount of the solder container is calculated based on the detection result. Thus, it is determined whether the solder container is empty of solder, that is, it is determined whether the solder in the solder container has run out.

Patent Literature 1: JP-A-2012-106416

SUMMARY

According to the technology disclosed in the above patent literature, it is possible to suitably detect that solder in a solder container has run out. However, with this technology, it is only possible to detect that solder in a solder container has run out in a solder supply device that moves a solder container by driving an electromagnetic motor.

Also, technology exists to detect that solder in a solder container has run out using a light sensor configured from a light emitter and a light receiver. In detail, a light emitter is provided on an outer circumferential surface near the bottom surface of the solder container, and light is emit from the light emitter towards the inside of the solder container. Further, a light receiver is provided at a position to be able to receive the light emitted from the light emitter. Thus, when the light receiver receives the emitted light, it is detected that solder in the solder container has run out. This is because, if solder remains inside the solder container, the light emitted from the light emitter is blocked by the solder and thus is not received by the light receiver.

Thus, by using a light sensor, it is possible to detect that solder has run out even for a solder supply device that moves a solder container using the driving of an item other than an electromagnetic motor. However, to detect that solder has run out using this technology, a solder container formed from a material through which light can pass is required. Also, even for a solder container formed from a material through which light can pass, if the outer diameter of the solder container is large, it is possible that the light receiver does not receive the light suitably. Further, the sensitivity of receiving the emitted light changes based on factors such as how dirty the inside of the solder container is and the material of the solder container meaning that it may not be detected suitably that solder has run out. The present disclosure takes account of these circumstances and an object thereof is to suitably detect that solder has run out in a variety of types of solder supply devices that supply solder by moving a solder container.

To solve the above problems, the solder supply device disclosed is a solder supply device comprising: a solder container housing liquid solder that is tubular and open at one end; a nozzle, for ejecting solder from the solder container, that is inserted into the solder container; a piston that is fixedly provided on an outer circumferential section of the nozzle and that is engaged inside of the solder container from the opening of the solder container, wherein the solder supply device supplies solder from the tip of the nozzle by the solder container moving such that the piston advances inside the solder container, and wherein the solder supply device includes a magnet provided on an outer circumferential surface of the solder container, and a sensor provided at a position facing the outer circumferential surface of the solder container so as to detect the approaching of the magnet due to the movement of the solder container.

Further, according to another aspect of the disclosure, the solder supply device is further provided with an outer tube that is tubular with an opening at one end and that stores the solder container in a state with the other end of the solder container engaged from the opening, and the solder container is moved by air being supplied to an air chamber that is demarcated by the other end of the solder container and the other end of the outer tube, so as to supply solder from the tip of the nozzle.

Further, according to another aspect of the disclosure, the sensor is provided on an outer section of the outer tube and faces the outer circumferential surface of the solder container via the outer tube, and at least a portion of the outer tube that faces the sensor is formed from non-magnetic material.

Further, according to another aspect of the disclosure, at least one of the magnet and the sensor are provided in a plural quantity lined up in a movement direction of the solder container.

Further, according to another aspect of the disclosure, the solder container has a flange section formed on the outer circumferential section thereof, wherein the magnet is a ring-shaped member with an inside diameter that is smaller than the outer diameter of the flange section of the solder container, and larger than the outer diameter of the tubular portion of the solder container excluding the flange section.

Advantageous Effects

With the solder supply device disclosed, a magnet is provided in the outer circumferential surface of the solder container. Also, a sensor is provided at a position facing the outer circumferential surface of the solder container so as to detect the approaching of the magnet due to the movement of the solder container. By this, based on the positions of the magnet and the sensor, it is possible to detect the post-movement position of the solder container. That is, it is possible to detect that solder has run out regardless of the the type of drive source used to move the solder container. Thus, according to the solder supply device disclosed, it is possible to suitably detect that solder has run out in a variety of types of solder supply devices that supply solder by moving a solder container.

Further, with the solder supply device according to another aspect, the solder container is engaged from the bottom surface inside a tubular outer tube with an opening at one end. And, by air being supplied to an air chamber demarcated by the bottom surface of the outer tube and the bottom surface of the solder container, the solder container moves, such that solder is supplied from the solder container. In other words, the piston moves by the bottom surface of the solder container being pressed directly by air. By this, the pressure inside the solder container increases and solder is supplied from the solder container. In this way, according to the solder supply device of this aspect, it is possible to supply solder from a solder container without using an air cylinder, electromagnetic motor, or the like, and it is possible to make the solder supply device compact and having a simple construction.

Further, with the solder supply device according to another aspect, the sensor is provided on an outer section of the outer tube and faces the outer circumferential surface of the solder container via the outer tube. Also, at least a portion of the outer tube that faces the sensor is formed from non-magnetic material. By this, it is possible to provide the sensor on an outside section of the outer tube, not inside the outer tube where there is virtually no space, and to detect the approaching of the magnet using the sensor.

Further, with the solder supply device according to another aspect, at least one of the magnet and the sensor are provided in a plural quantity lined up in a movement direction of the solder container. By this, it is possible to detect the post-movement solder container at multiple locations. Thus, for example, it is possible to detect not just that solder has run out, but also that the amount of solder in the solder container has run low.

Further, with the solder supply device according to another aspect, a flange section is formed on the outer circumferential surface of the solder container. Also, the magnet is ring-shaped, and the inside diameter of the ring-shaped magnet is smaller than the outer diameter of the flange section and is larger than the outer diameter of the tubular portion of the solder container excluding the flange section. Thus, it is possible to attach the ring-shaped magnet to the outer circumferential surface of the solder container so as to catch on the flange section. In other words, it is possible to attach the magnet to the solder container without using a tool or the like. This simplifies the construction and lowers costs.

DESCRIPTION OF PREFERRED EMBODIMENTS

Figure 1:
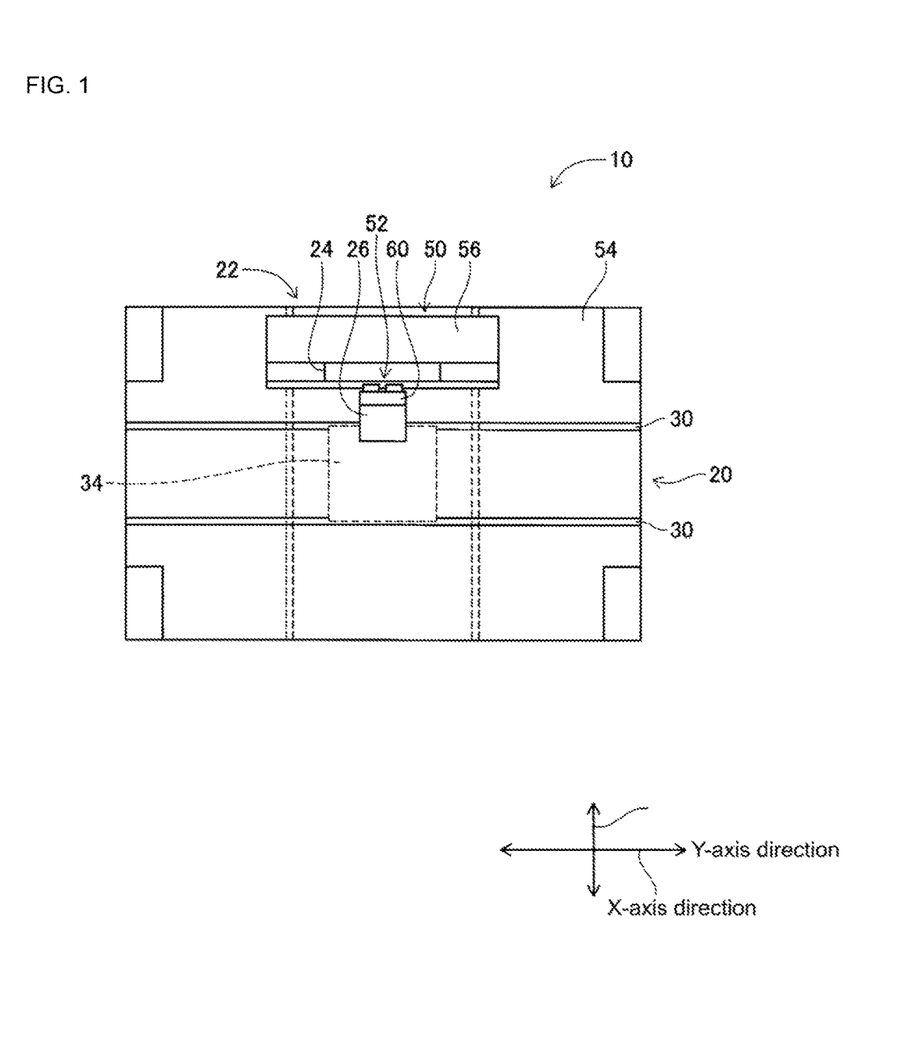
FIG. 1 is a plan view showing a solder printer of an embodiment.

The following describes in detail referring to the figures an example embodiment of the present disclosure.
<Configuration of Solder Printer>
FIG. 1 shows solder printer 10 as an embodiment of the disclosure. Solder printer 10 is a device that prints solder paste onto a circuit board. Solder printer 10 is provided with conveyance device 20, moving device 22, squeegee device 24, and solder supply device 26.

Conveyance device 20 has a pair of conveyor belts 30 that extend in the X-axis direction, and electromagnetic motor (refer to FIG. 4) 32 that moves conveyor belts 30. The pair of conveyor belts 30 support circuit board 34 and circuit board 34 is conveyed in the X-axis direction by the driving of electromagnetic motor 32. Also, conveyance device 20 has holding device (refer to FIG. 4) 36. Holding device 36 fixedly holds circuit board 34 supported by conveyor belts 30 in a predetermined position (the position at which circuit board 34 is shown in FIG. 1), Note that a metal mask (not shown) is loaded on the upper surface of circuit board 34.

Moving device 22 is configured from Y-axis direction slide mechanism 50 and X-axis direction slide mechanism 52. Y-axis direction slide mechanism 50 has Y-axis slider 56 provided on base 54 so as to be movable in the Y-axis direction. Y-axis slider 56 is moved to any position in the Y-axis direction by the driving of electromagnetic motor (refer to FIG. 4) 58. Also, X-axis direction slide mechanism 52 has X-axis slider 60 provided on a side surface of Y-axis slider 56 to be movable in the X-axis direction. X-axis slider 60 is moved to any position in the X-axis direction by the driving of electromagnetic motor (refer to FIG. 4) 62.

Squeegee device 24 is attached to Y-axis slider 56 about conveyance device 20, and moves to any position above circuit board 34 that is held by conveyance device 20. Squeegee device 24 has a squeegee (not shown) and the squeegee is held extending downwards by squeegee device 24 to be movable in the Y-axis direction and the up/down directions. Further, the squeegee is moved in the Y-axis direction by the driving of electromagnetic motor (refer to FIG. 4) 66, and is moved up/down by the driving of electromagnetic motor (refer to FIG. 4) 68.

Figure 2:
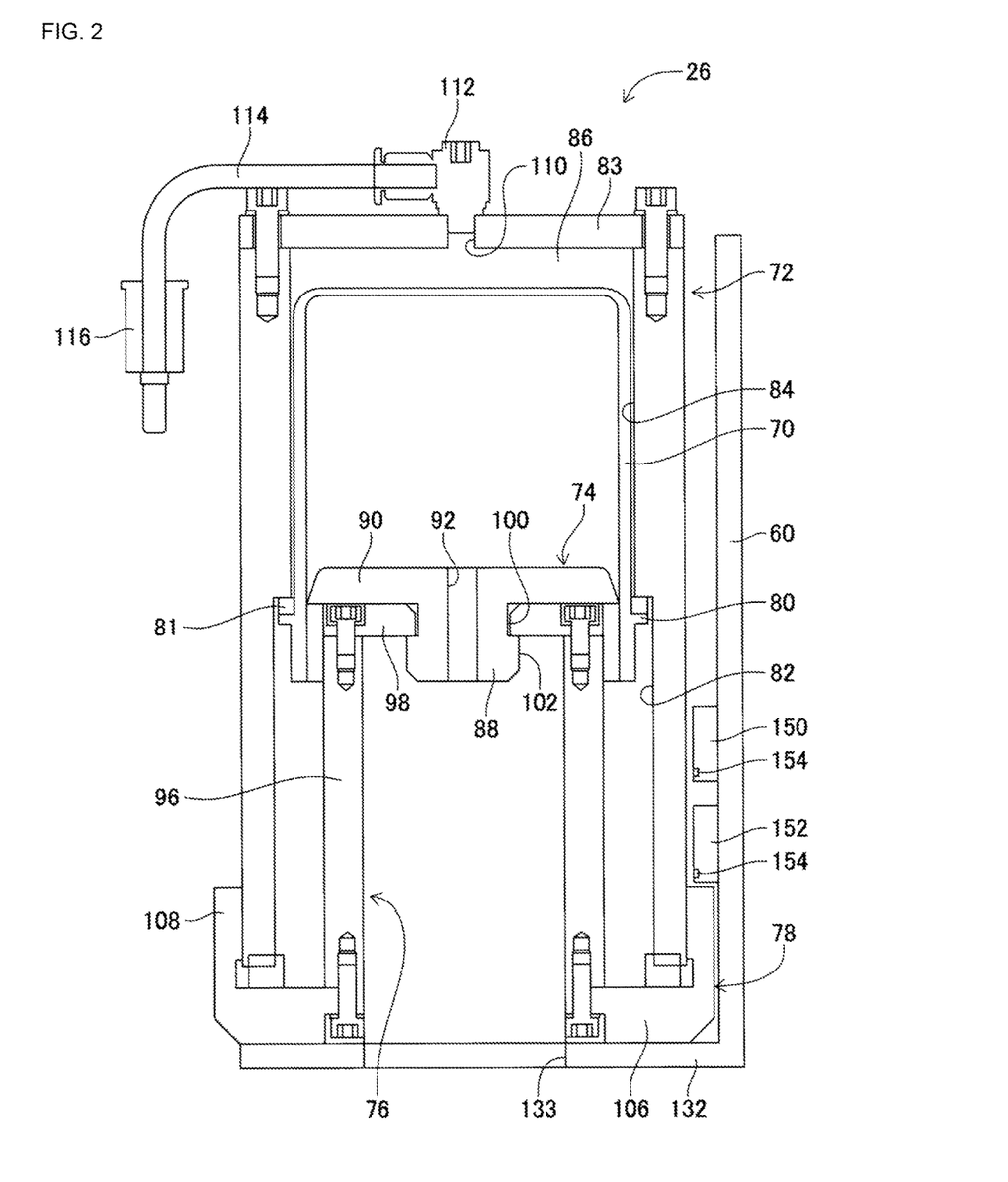
FIG. 2 is a cross-section view showing a solder supply device provided in the solder printer of FIG. 1.

Solder supply device 26 is attached to X-axis slider 60 and is moved to any position above base 54 by moving device 22. As shown in FIG. 2, solder supply device 26 has solder cup 70, outer tube 72, supply nozzle 74, inner tube 76, and fixed lid 78. Solder cup 70 is a bottomed cylindrical container with an opening at one end; solder cup 70 is filled with solder paste. Flange section 80 is formed on the outer circumferential surface at the opening side of solder cup 70; a screw thread (not shown) is formed between flange 80 and the edge of the opening side. Solder cup 70 is sold commercially with a lid (not shown) that engages with the screw thread covering the opening. That is, solder paste manufacturers sell solder cups 70 after filling solder cups 70 with solder paste and covering the opening with a lid. Users purchase solder cups 70 and use them with the lid removed.

Further, ring-shaped magnet 81 is attached to the outer circumferential section of solder cup 700. In detail, the inside diameter of ring-shaped magnet 81 is smaller than the outer diameter of flange section 80 of solder cup 70, and is larger than the outer diameter of the tubular portion of solder container 70 excluding flange section 80. Also, solder cup 70 is engaged with the inside diameter section of ring-shaped magnet 81 from the bottom surface side of solder cup 70. By this, magnet 81 catches on flange section 80 and is thus attached to the outer circumferential section of solder cup 70. Note that, the outer diameter of magnet 81 is smaller than the outer diameter of flange section 80, such that magnet 81 that is caught on flange section 80 does not protrude from the outer edge of flange section 80.

Also, outer tube 72, similar to solder cup 70, is a bottomed cylinder with an opening at one end; solder cup 70 is stored inside outer tube 72. In detail, the inner circumferential surface of outer tube 72 is configured from first inner circumferential surface 82 that is positioned at the opening side of outer tube 72, and second inner circumferential surface 84 that is positioned at bottom surface 83 of outer tube 72. The inside diameter of first inner circumferential surface 82 is slightly larger than the outer diameter of flange section 80 of solder cup 70; the inside diameter of second inner circumferential surface 84 is slightly larger than the outer diameter of the tubular section of solder cup 70. Further, the end of the bottom side of solder cup 70 is engaged from the opening of outer tube 72 such that solder cup 70 is stored in outer tube 72. By this, solder cup 70 is slidable inside outer tube 72.

However, the depth dimension of a portion of second inner circumferential surface 84 of outer tube 72 is longer than the length dimension from magnet 81 caught on flange section 80 of solder cup 70 to the bottom surface of solder cup 70, and magnet 81 caught on flange section 80 of solder cup 70 contacts the step surface between first inner circumferential surface 82 and second inner circumferential surface 84 of outer tube 72. Therefore, space 86 is formed between the bottom surface of solder cup 70 and bottom surface 83 of outer tube 72. Note that; outer tube 72 is formed from a non-magnetic material such as aluminum. Also note that, herein, the bottom surface refers to the surface on the opposite side to the opening of a bottomed cylindrical member. In other words, even if the surface on the opposite side to the opening of a bottomed cylindrical member is positioned towards the top, and the opening is positioned towards the bottom, the surface on the opposite side to the opening is given as the bottom surface, not the lid.

Also, supply nozzle 74 is configured from nozzle section 88 and flange section 90; nozzle section 88 and flange section 90 are formed as one body from material that is elastically deformable. Nozzle section 88 is substantially cylindrical with nozzle hole 92 formed running through the inside. Flange section 90 extends in a disk shape from the outer circumferential surface of an end of the nozzle section; the outer diameter of flange section 90 is slightly larger than the inside diameter of solder cup 70. Also, flange section 90 is engaged inside solder cup 70 such that nozzle section 88 faces the opening side of solder cup 70; supply nozzle 74 slides inside solder cup 70 with the outer circumferential section of flange section 90 elastically deformed.

Further, inner tube 76 has cylindrical tube section 96, and ring section 98 that covers the edge of tube section 96; supply nozzle 74 is held by ring section 98. In detail, the outer circumferential surface of nozzle section 88 of supply nozzle 74 is configured from first outer surface 100 positioned on the flange section 90 side and second outer circumferential surface 102 positioned at the tip side of nozzle section 88; the outer diameter of first outer diameter surface 100 is smaller than the outer diameter of second outer circumferential surface 102. On the other hand, the inside diameter of ring section 98 of inner tube 76 is slightly larger than the outer diameter of first outer circumferential surface 100 and slightly smaller than the outer diameter of second outer circumferential surface 102. Also, nozzle section 88 engages with the inside diameter section of ring section 98 while a portion of second circumferential surface 102 is elastically deformed, and the inside diameter of ring section 98 and outer circumferential surface 100 of nozzle section 88 engage. By this, inner tube 76 holds supply nozzle 74 using ring section 98. Note that, inner tube 76 holds supply nozzle 74 using ring section 98, therefore inner tube 76 is positioned inside solder cup 70; however, the end of the side not positioned at ring section 98 of tube section 96 extends from the opening of solder cup 70.

Also, by pulling supply nozzle 74 away from inner tube 76, a portion of second outer circumferential 102 of nozzle section 88 is elastically deformed such that supply nozzle 74 can be removed from inner tube 76. However, the force required to elastically deform the portion of second outer circumferential surface 102 of nozzle section 88 when removing supply nozzle 74 from inner tube 76, that is the holding force of supply nozzle 74 by inner tube 76, is larger than the friction that arises between flange section 90 of supply nozzle 74 engaged inside solder cup 70 and the inner circumferential surface of solder cup 70. Thus, when inner tube 76 holding suction nozzle 74 is pulled in a direction away from solder cup 70, supply nozzle 74 is not separated from inner tube 76, and is removed from solder cup 70 together with inner tube 76.

Further, fixed lid 78 has ring section 106, and erected section 108 established around the entire circumference at the outer edge of ring section 106. A screw thread (not shown) is formed on the inner circumferential surface of erected section 108, the screw thread being engaged with the screw thread (not shown) formed at the opening end side of outer tube 72. By this, fixed lid 78 is removably attached to the opening of outer tube 72. Also, the inside diameter of ring section 106 is substantially the same as the inside diameter of tube section 96 of inner tube 76, and the end section that extends from solder cup 70 of tube section 96 is fixed to the inside edge of ring section 106. Thus, by removing fixed lid 78 from outer tube 72, inner tube 76 is also removed from inside outer tube 72. In this case, supply nozzle 74 held by inner tube 76 is also removed from inside outer tube 72. Further, solder cup 70 is also removed from outer tube 72 by the friction arising between flange section 90 of supply nozzle 74 and the inner circumferential surface of solder cup 70. That is, by removing fixed lid 78 from outer tube 72, inner tube 76, supply nozzle 74, and solder cup 70 are removed as one from outer tube 72.

Also, through-hole 110 is formed in bottom surface 83 of outer tube 72, and air adapter 112 is attached in through-hole 110. Air adapter 112 is connected to an end of air tube 114, and the other end of air tube 114 is connected to device-side air coupler 116. By connecting slider-side air coupler (refer to FIG. 3) 118 provided at the arrangement position of solder supply device 26 to device-side air coupler 116, air is supplied to space 86 inside outer tube 72, and solder paste is ejected from nozzle hole 92 of supply nozzle 74.

Figure 3:
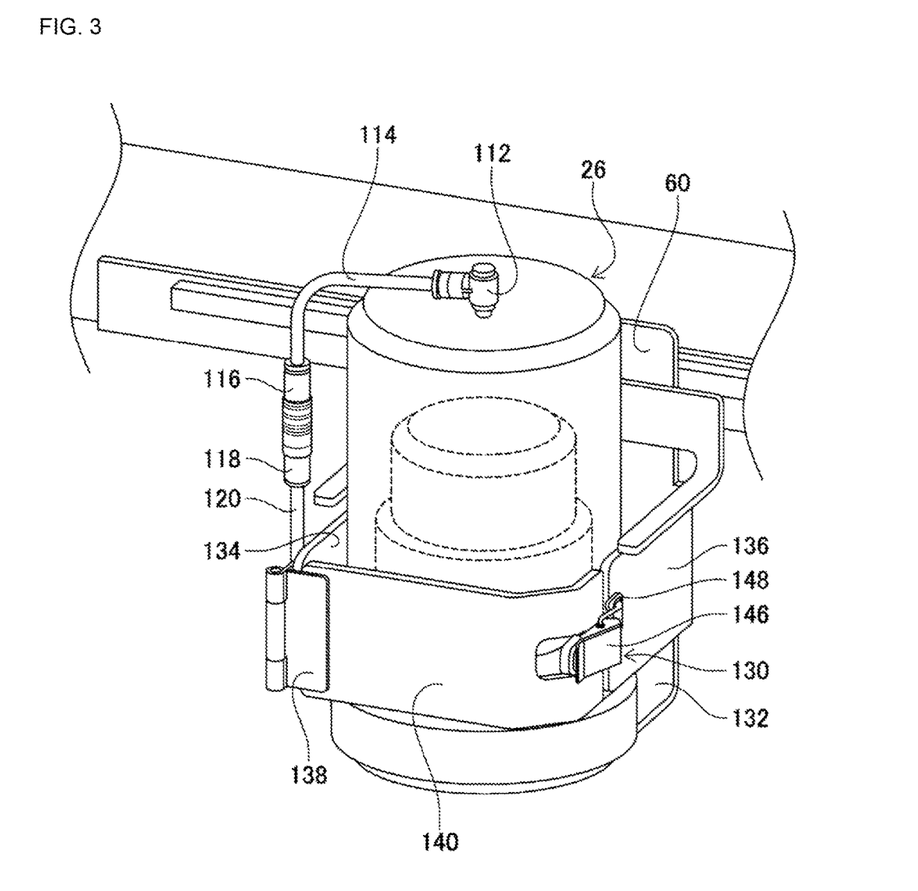
FIG. 3 is a perspective view showing the solder supply device of FIG. 2.

In detail, as shown in FIG. 3, an end of air tube 120 is connected to slider-side air coupler 118, and the other end of air tube 120 is connected to air supply device (refer to FIG. 4) 122. By this, air is supplied from air supply device 122 to space 86 inside outer tube 72. When air is supplied to space 86, the bottom surface of solder cup 70 is pressed towards supply nozzle 74 and solder cup 70 moves down. In this case, the solder paste filling solder cup 70 is compressed and is ejected from nozzle hole 92 of supply nozzle 74. Solder paste ejected from nozzle hole 92 passes through tube section 96 of inner tube 76, and the inner section of ring section 106 of fixed lid 78, and is ejected to the outside of solder supply device 26. Thus, solder supply device 26 supplies solder paste.

In this way, with solder supply device 26, space 86 is demarcated by the bottom surface of solder cup 70 and bottom surface 83 of outer tube 72, with space 86 functioning as an air chamber. That is, by the bottom surface of solder cup 70 being directly pressed by air, solder paste inside solder cup 70 is ejected from nozzle hole 92. Thus, with solder supply device 26, it is not necessary to provide a cylinder device or the like for pushing solder cup 70, and solder supply device 26 can be made more compact. Also, because there is no need to provide a cylinder device or the like, costs are reduced. Further, because there is no need to provide a cylinder device or the like, the configuration of solder supply device 26 can be made simple.

Also, as shown in FIG. 3, solder supply device 26 is detachably mounted on X-axis slider 60 by clip lock 130. In detail, bracket 132 is attached to the lower end of X-axis slider 60, and the lower surface of solder supply device 26 is supported by bracket 132. In other words, solder supply device 26 is able to be loaded on bracket 132. Note that, through-hole (refer to FIG. 2) 133 approximately the same as the inner diameter of ring section 106 of fixed lid 78 of solder supply device 26 is formed in bracket 132. By this, solder paste is supplied from solder supply device 26 loaded on bracket 132 via through-hole 133 in bracket 132.

Two surrounding plates 134 and 136 are fixed on X-axis slider 60 above bracket 132 facing each other and perpendicular to bracket 132. The distance between the two surrounding brackets 134 and 136 is slightly longer than the outer diameter of outer tube 72 of solder supply device 26, and solder supply device 26 is loaded between the two surrounding plates 134 and 136. Also, an end of opening/closing plate 140 is attached to surrounding plate 134 via hinge 138. Lever section 146 of clip lock 130 is provided on the other end of opening/closing plate 140, and hook stopper 148 of clip lock 130 is provided on surrounding plate 136. Also, by performing locking with opening/closing plate 140 in a closed state and lever section 146 latched onto hook stopper 148, solder supply device 26 is fixedly mounted on X-axis slider 60. Also, by releasing the locking of clip lock 130 and opening opening/closing plate 140, solder supply device 26 is able to be removed from X-axis slider 60. Note that, device-side air coupler 116 and slider-side air coupler 118 are detachable, and device-side air coupler 116 is removed from slider-side air coupler 118 when solder supply device 26 is removed from X-axis slider 60.

Further, as shown in FIG. 2, two magnetic sensors 150 and 152 are provided on X-axis slider 60 so as to face the outer circumferential surface of outer tube 72 of solder supply device 26. Each magnetic sensor 150 and 152 has detection section 154 that detects the approaching of magnet 81 to detection section 154. Also, the two magnetic sensors 150 and 152 are provided lined up in the up/down direction, and the distance between the detection sections 154 of the two magnetic sensors 150 and 152 is about one fifth of the depth dimension of solder cup 70.

Figure 4:
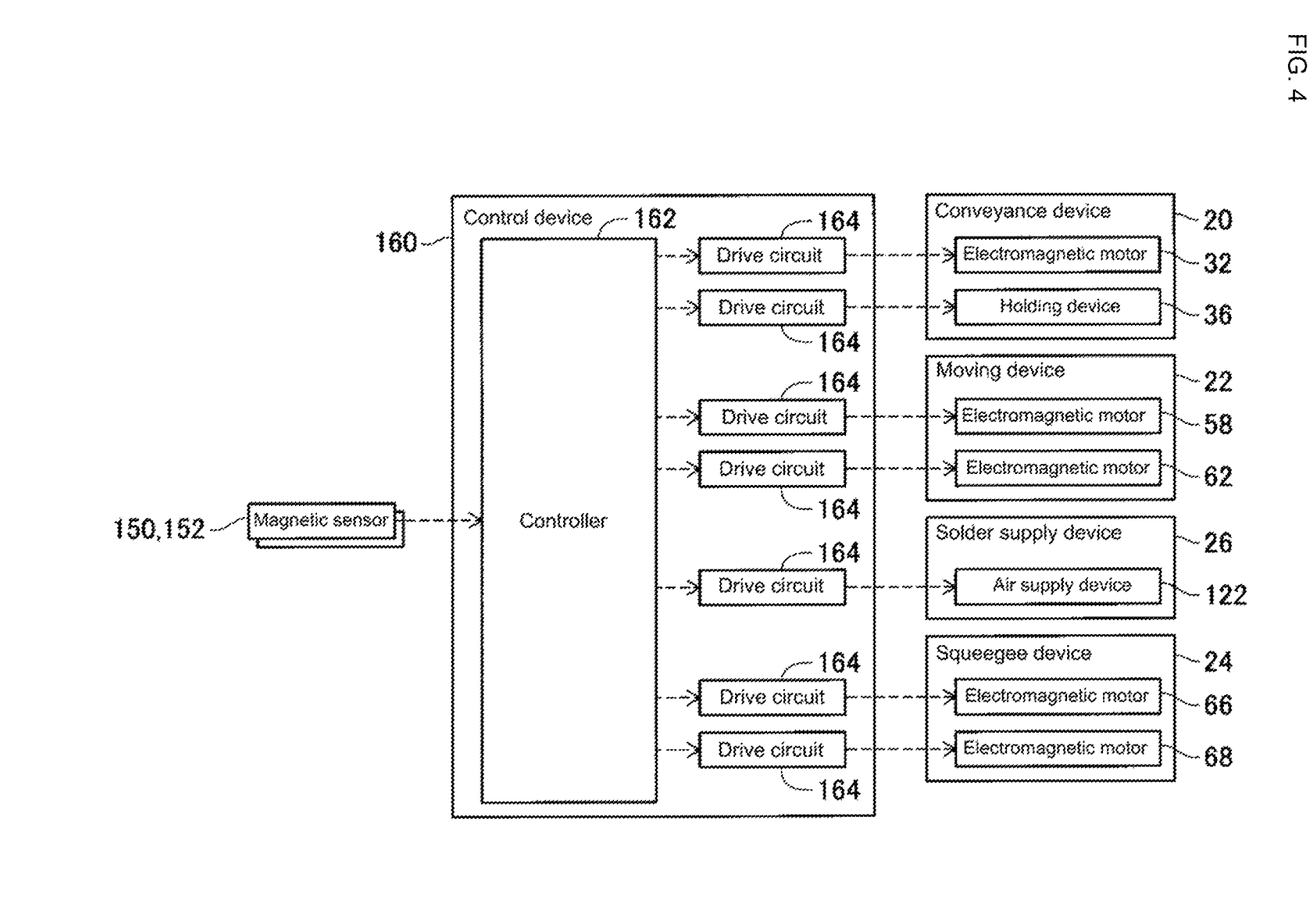
FIG. 4 is a block diagram showing the control device provided in the solder printer of FIG. 1.

Also, as shown in FIG. 4, solder printer 10 is provided with control device 160. Control device 160 is provided with controller 162 and multiple drive circuits 164. Multiple drive circuits 164 are connected to the above-mentioned electromagnetic motors 32, 58, 62, 66, and 68, holding device 36, and air supply device 122. Also, controller 162 is provided with a CPU, ROM, and RAM, forming the main parts of a computer, and is connected to the multiple drive circuits 164. Thus, the operation of conveyance device 20, moving device 22, squeegee device 24, and solder supply device 26 is controlled by controller 162. Further, controller 162 is connected to magnetic sensors 150 and 152, and acquires detection signals of magnet 81 from magnetic sensors 150 and 152.

<Printing of Solder Paste to Circuit Board>

With solder printer 10, according to the above-described configuration, solder paste is supplied onto the upper surface of a metal mask loaded on circuit board 34 by solder supply device 26, and that solder paste is applied by squeegee device 24. Pattern holes matching the pattern of the pads and so on of circuit board 34 are formed in the metal mask, and solder paste is printed onto circuit board 34 via the pattern holes.

Specifically, based on commands of controller 162, circuit board 34 is conveyed to a work position, and fixedly held at that position by holding device 36. Then, solder supply device 26, based on commands of controller 162, moves to a prescribed position above circuit board 34. Continuing, based on commands of controller 162, solder supply device 26 supplies air from air supply device 122 into space 86 inside outer tube 72. By this, solder paste is ejected from nozzle hole 92, thus supplying solder paste onto the upper surface of the metal mask loaded on circuit board 34. Next, based on commands of controller 162, squeegee device 24 is moved above the location where solder paste was supplied. Then, based on commands of controller 162, squeegee device 24 moves a squeegee down and then moves in the Y-axis direction. By this, solder paste is applied on the upper surface of the metal mask, and solder paste thus enters into the pattern holes. In this manner, solder printer 10 prints solder paste onto circuit board 34.

<Detecting that the Solder Cup has Run Out of Solder>

As described above; when printing solder paste onto circuit board 34, solder paste is supplied from solder cup 70 of solder supply device 26; thus, solder cup 70 becomes empty and empty solder cup 70 needs to be replaced with a solder cup 70 filled with solder paste. Therefore, with solder supply device 26, by detecting the approaching of magnet 81 using magnetic sensors 150 and 152, it is detected that the remaining amount of solder in solder cup 70 is small, and that solder in solder cup 70 has run out.

Figure 5:
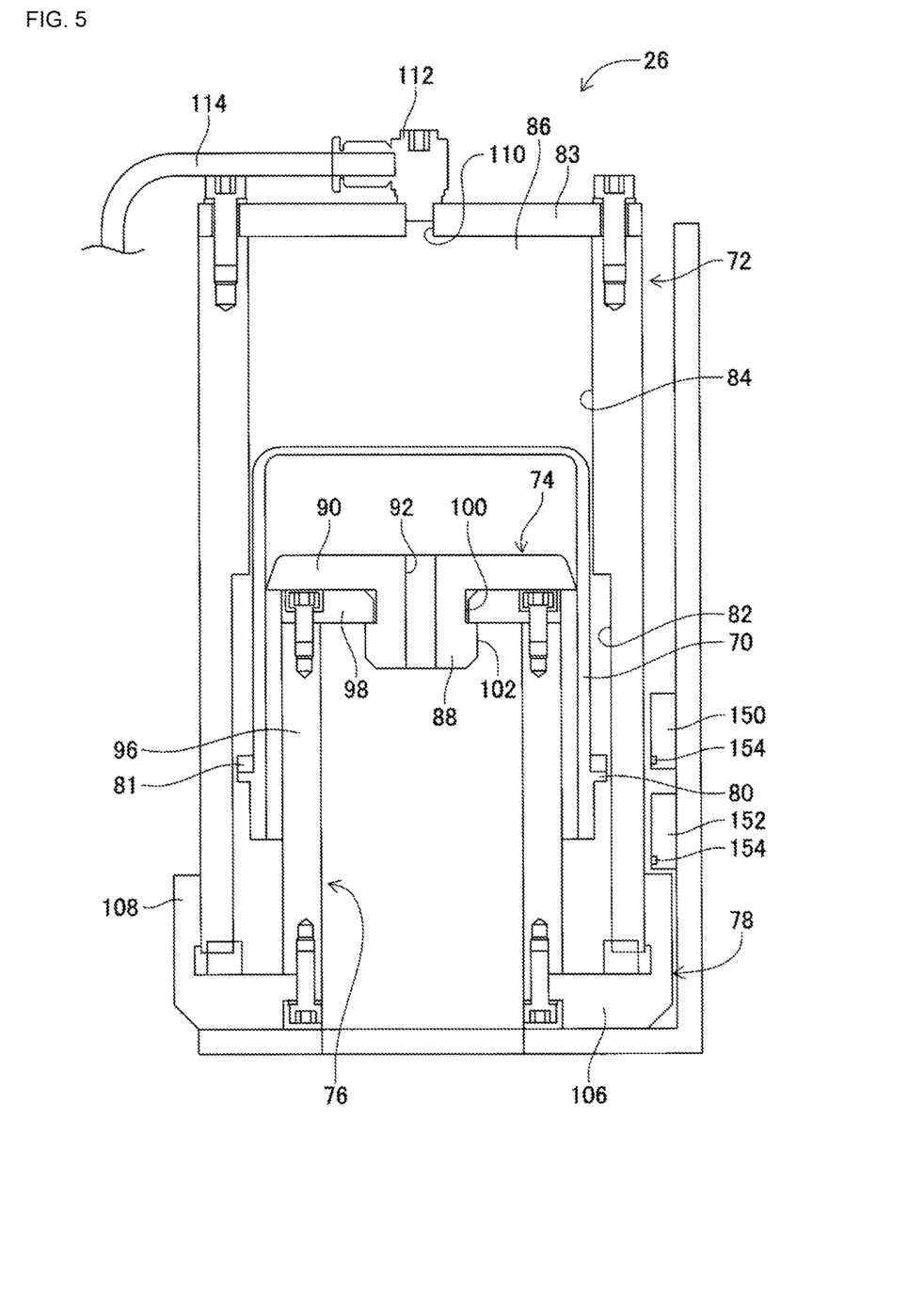
FIG. 5 is a cross-section view showing the solder supply device with little solder remaining in the solder cup.

Specifically, when supplying solder using solder supply device 26, as described above, air is supplied to space 86 inside outer tube 72 from air supply device 122. By this, the bottom surface of solder cup 70 is pressed towards supply nozzle 74 and solder cup 70 moves down. As shown in FIG. 5, by this downward movement of solder cup 70, magnet 81 faces detection section 154 of magnetic sensor 150 via outer tube 72. In this case, because outer tube 72 is formed from a non-magnetic material, the approaching of magnet 81 is detected by detection section 154 of magnetic sensor 150, and a detection signal of magnet 81 is entered into controller 162 from magnetic sensor 150. Then, controller 162 displays the fact that the remaining amount of solder in solder cup 70 is small on a display device (not shown). This notifies an operator that solder cup 70 has been lowered to the position shown in FIG. 5 and that the remaining amount of solder in solder cup 70 is small.

Figure 6:
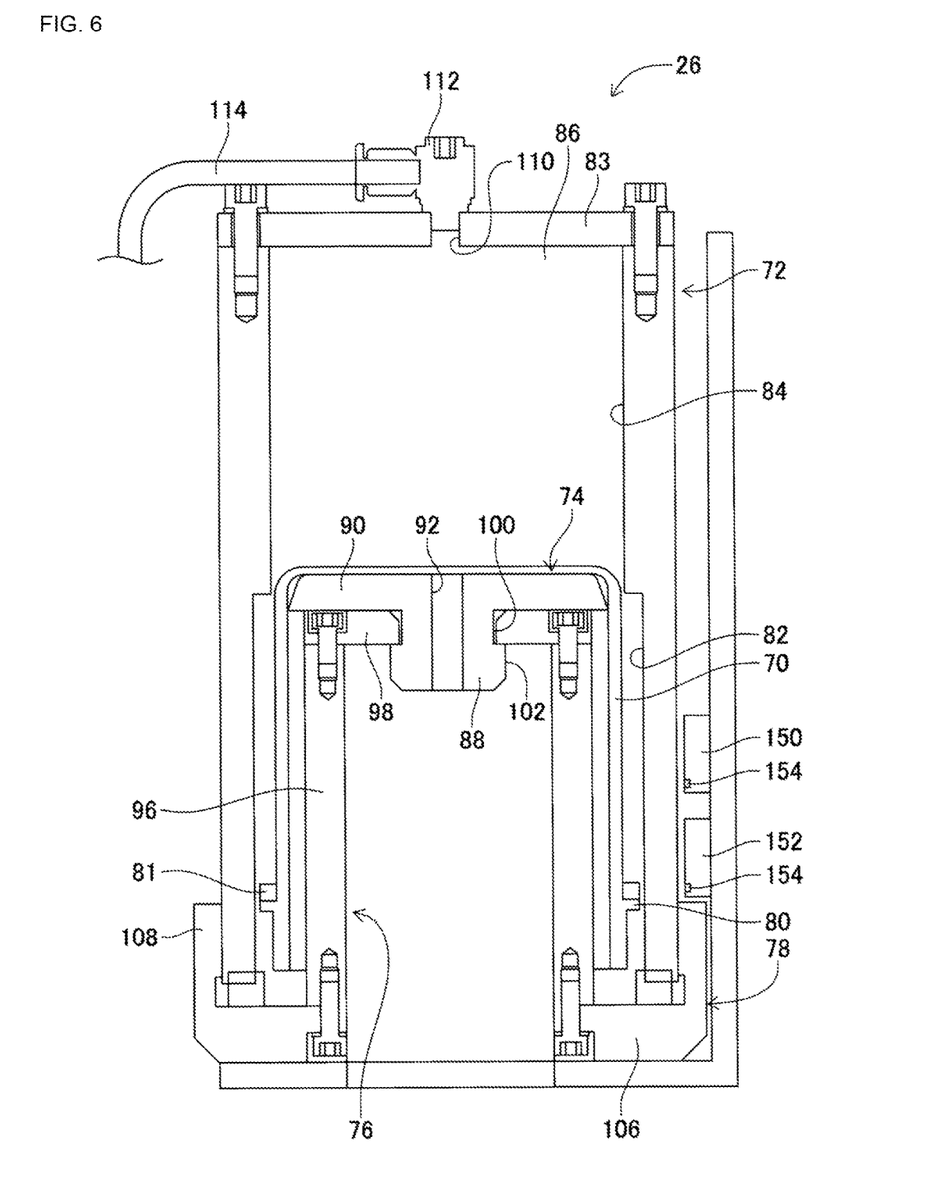
FIG. 6 is a cross-section view showing the solder supply device with an empty solder cup.

When solder is further supplied from solder supply device 26, solder cup 70 is lowered further and the bottom surface of solder cup 70 contacts supply nozzle 74. In other words, solder cup 70 becomes empty. In this case, as shown in FIG. 6, magnet 81 faces detection section 154 of magnetic sensor 152 via outer tube 72. By the approaching of magnet 81 is detected by detection section 154 of magnetic sensor 152, and a detection signal of magnet 81 is entered into controller 162 from magnetic sensor 152. Then, controller 162 displays the fact that solder cup 70 is empty on a display device. By this, an operator is informed that solder cup 70 is empty, that is, that solder has run out from inside solder cup 70, and thus performs solder cup 70 exchange work.

As described above, with solder supply device 26, it is possible to notify an operator of the fact that the remaining amount of solder in solder cup 70 is small, thus an operator can perform preparation for solder cup exchange work. Also, an operator is suitably informed when solder has run out, so is able to perform exchange work of solder cup 70 promptly.

Further, magnet 81 used for detecting that solder has run out and so on is ring-shaped, and is attached to solder cup 70 so as to catch on flange section 80. Thus, magnet 81 is attached to solder cup 70 without using a tool or the like. This simplifies the construction and lowers costs.

Note that, in the above embodiments, solder supply device 26 is an example of a solder supply device. Solder cup 70 is an example of a solder container. Outer tube 72 is an example of an outer tube. Flange section 80 is an example of a flange section. Magnet 81 is an example of a magnet. Space 86 is an example of an air chamber. Nozzle section 88 is an example of a nozzle. Flange section 90 is an example of a piston. Magnetic sensors 150 and 152 are each an example of a sensor.

Further, the present disclosure is not limited to the above example embodiment, and various changed or improved methods of embodiment are possible based on the knowledge of someone skilled in the art. Specifically, for example, in the above embodiment, a solder supply device that moves solder cup 70 by supplying air to space 86 demarcated by solder cup 70 and outer tube 72 and so on is used; however, a solder supply device that moves solder cup 70 using a drive source such as a cylinder device or electromagnetic motor may be used.

Also, in the above embodiment, outer tube 72 is formed from non-magnetic material; however, the outer circumferential surface only of outer tube 72 may be formed from non-magnetic material. Further, the portion of outer tube 72 that faces magnetic sensors 150 and 152 only may be formed from non-magnetic material.

Also, in the above embodiment, magnetic sensors 150 and 152 are provided outside of outer tube 72; however, magnetic sensors 150 and 152 may be provided inside outer tube 72. In this case, it is not necessary for outer tube 72 to be formed from non-magnetic material.

Also, in the present embodiment, multiple magnetic sensors 150 and 152 are provided spaced at intervals in the up/down direction; however, multiple magnets may be provided spaced at intervals in the up/down direction. With multiple magnets provided, the same effects are realized by providing multiple magnetic sensors.

REFERENCE SIGNS LIST

26: solder supply device; 70: solder cup (solder container); 72: outer tube; 80: flange section; 81: magnet; 86: space (air chamber); 88: nozzle section (nozzle); 90: flange section (piston); 150: magnetic sensor (sensor); 152: magnetic sensor (sensor)

The invention claimed is:

1. A solder supply device comprising:
a solder container housing liquid solder that includes a tubular section, an opening at a first end, and a bottom at a second end, the solder container including a flange section closer to the first end of the solder container than to the second end of the solder container;
an outer tube that is tubular with an opening at a first end of the outer tube and a bottom at a second end of the outer tube, the outer tube slidably stores the solder container inside the outer tube, the outer tube including a first inner circumferential surface closer to the first end of the outer tube and a second inner circumferential surface closer to the second end of the outer tube, an inside diameter of the first inner circumferential surface being greater than an outer diameter of the flange section of the solder container, and an inside diameter of the second inner circumferential surface being greater than an outer diameter of the tubular section of the solder container;
an inner tube including a cylindrical tube section and a ring section which covers an edge of the cylindrical tube section of the inner tube; and
a supply nozzle including a nozzle section and a flange section, for ejecting solder from the solder container, that is inserted into the solder container, and
wherein the flange section of the supply nozzle is fixedly provided on an outer circumferential section of the nozzle section and that is engaged inside of the solder container from the opening of the solder container,
wherein the supply nozzle is fixedly held by the ring section of the inner tube,
wherein the solder supply device supplies solder from a tip of the nozzle section by moving the solder container such that the flange section of the supply nozzle advances inside the solder container and the solder exits the supply nozzle via a nozzle hole in the nozzle section, the solder container being moved by air being supplied to an air chamber that is demarcated by the second end of the solder container and the second end of the outer tube such that the bottom of the solder container moves towards the supply nozzle, and
wherein the solder supply device includes
a magnet provided on an outer circumferential surface of the solder container, and
a sensor provided at a fixed position facing the outer circumferential surface of the solder container so as to detect an approaching of the magnet due to movement of the solder container.

2. The solder supply device according to claim 1, wherein the sensor is provided on an outer section of the outer tube and faces the outer circumferential surface of the solder container, and at least a portion of the outer tube that faces the sensor is formed from non-magnetic material.

3. The solder supply device according to claim 1, wherein the sensor is provided in a plural quantity lined up in a movement direction of the solder container.

4. The solder supply device according to claim 1, wherein the magnet is a ring-shaped member with an inside diameter that is smaller than the outer diameter of the flange section of the solder container, and larger than the outer diameter of the tubular section of the solder.

5. The solder supply device according to claim 1, wherein the magnet abuts the flange section of the solder container.

6. The solder supply device according to claim 1, wherein the nozzle section includes a first outer circumferential surface on the flange section of the supply nozzle side of the nozzle section and a second outer circumferential surface on a tip section side of the nozzle section, an outer diameter of the second outer circumferential surface of the nozzle section being greater than an outer diameter of the first outer circumferential surface of the nozzle section.

7. The solder supply device according to claim 6, wherein the outer diameter of first outer circumferential surface of the nozzle section is smaller than an inside diameter of the ring section of the inner tube.

* * * * *